(12) United States Patent
Haynes et al.

(10) Patent No.: US 9,591,770 B2
(45) Date of Patent: Mar. 7, 2017

(54) MULTI-LAYER CERAMIC VACUUM TO ATMOSPHERE ELECTRIC FEED THROUGH

(71) Applicant: KLA-Tencor Corporation, Milpitas, CA (US)

(72) Inventors: Robert Haynes, Pleasanton, CA (US); Mehran Nasser-Ghodsi, Hamilton, MA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 383 days.

(21) Appl. No.: 14/256,828

(22) Filed: Apr. 18, 2014

(65) Prior Publication Data

US 2014/0318855 A1 Oct. 30, 2014

Related U.S. Application Data

(60) Provisional application No. 61/816,315, filed on Apr. 26, 2013.

(51) Int. Cl.
*H02G 3/22* (2006.01)
*H02G 1/14* (2006.01)
(Continued)

(52) U.S. Cl.
CPC .......... *H05K 3/4046* (2013.01); *H05K 1/147* (2013.01); *H05K 3/365* (2013.01); *H05K 3/4061* (2013.01);
(Continued)

(58) Field of Classification Search
CPC .. H02G 3/22; H02G 1/14; H02G 1/00; H02G 3/00; H02G 3/02; H02G 3/24;
(Continued)

(56) References Cited

U.S. PATENT DOCUMENTS 3,803,531 A * 4/1974 Sorensen ............. H01B 17/305
 174/151
3,828,118 A * 8/1974 Bushek ............. H01R 13/5202
 174/152 R
(Continued)

FOREIGN PATENT DOCUMENTS

EP 2193823 A2 6/2010
WO 2007035443 A1 3/2007
(Continued)

OTHER PUBLICATIONS

"Microsystems Technology in Germany 2010" Trias Consult, 2010. Downloaded from web Apr. 8, 2014.
(Continued)

*Primary Examiner* — Angel R Estrada
(74) *Attorney, Agent, or Firm* — Joshua D. Isenberg; JDI Patent

(57) ABSTRACT

Embodiments of this invention use multi-layer ceramic substrate with one or more hermetically sealed and filled metal vias with smaller pitch and size in combination with flexible printed circuit cables and interposers to provide a custom electric feed through for vacuum to atmosphere chambers. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

21 Claims, 5 Drawing Sheets

(51) Int. Cl.
*H05K 3/40* (2006.01)
*H05K 1/14* (2006.01)
*H05K 3/36* (2006.01)
*H05K 3/46* (2006.01)

(52) U.S. Cl.
CPC . *H05K 3/4629* (2013.01); *H05K 2201/10265* (2013.01); *H05K 2201/10378* (2013.01); *H05K 2201/10545* (2013.01); *Y10T 29/49155* (2015.01); *Y10T 29/49165* (2015.01)

(58) Field of Classification Search
CPC .. H05K 5/00; H05K 5/06; H05K 5/02; H05K 5/0091; H05K 3/4046; H05K 3/4038; H05K 1/147; H05K 3/365; H05K 3/4061; H05K 3/4629; H05K 2201/10265; H05K 2201/10378; H05K 2201/10545; Y10T 29/49155; Y10T 29/49165
USPC .. 174/652, 650, 50.6, 50.61, 520, 50.5, 151, 174/152 R; 361/302, 306.1, 600; 29/592.1, 846, 852
See application file for complete search history.

(56) References Cited

U.S. PATENT DOCUMENTS

| | | | |
|---|---|---|---|
| 3,852,877 | A | 12/1974 | Ahn et al. |
| 5,434,358 | A | 7/1995 | Glahn et al. |
| 6,255,601 | B1 | 7/2001 | Burkhart |
| 6,305,975 | B1 | 10/2001 | Steiner |
| 6,660,116 | B2 * | 12/2003 | Wolf ............... H01G 4/35 361/302 |
| 7,068,491 | B1 | 6/2006 | Burdon et al. |
| 7,244,895 | B1 * | 7/2007 | Borzabadi ....... B60R 16/0222 174/650 |
| 8,399,762 | B2 | 3/2013 | Stolt et al. |
| 8,551,271 | B2 | 10/2013 | Ok et al. |
| 8,588,915 | B2 * | 11/2013 | Iyer ............... H01R 43/20 361/302 |
| 2002/0050951 | A1 | 5/2002 | Durham |
| 2002/0166618 | A1 | 11/2002 | Wolf et al. |
| 2008/0314502 | A1 | 12/2008 | Ok et al. |
| 2012/0098615 | A1 | 4/2012 | Morozov et al. |

FOREIGN PATENT DOCUMENTS

WO 2007035445 A1 3/2007
WO 2010141100 A1 12/2010

OTHER PUBLICATIONS

PCT International Search Report for PCT Application No. PCT/US2014/035567, dated Sep. 5, 2014.

U.S. Appl. No. 61/816,315, to Robert Haynes, filed Apr. 26, 2013.

* cited by examiner

MULTI-LAYER CERAMIC VACUUM TO ATMOSPHERE ELECTRIC FEED THROUGH

CLAIM OF PRIORITY

This application is a nonprovisional of and claims the priority benefit of commonly owned, co-pending U.S. Provisional Patent Application No. 61/816,315, to Robert Haynes et al., filed Apr. 26, 2013, and entitled "MULTI-LAYER CERAMIC VACUUM TO ATMOSPHERE ELECTRIC FEED THROUGH", the entire contents of which are herein incorporated by reference.

FIELD OF THE DISCLOSURE

Aspects of the present disclosure generally relate to electrical feedthroughs, and more particularly, to electrical feedthroughs for providing electrical connection to devices inside vacuum chambers.

BACKGROUND

Electrical feedthroughs are commonly used to transfer electrical power and signals between a device within a vacuum chamber and equipment positioned outside the vacuum chamber. For example, some devices in a vacuum chamber, such as thermal evaporation sources or substrate heater, need electrical power from the exterior of the vacuum chambers. In addition, some devices in vacuum chambers, such as temperature sensors or measurement devices, have to send signals to equipment outside of the vacuum chambers for analysis.

An electrical feedthrough for these environments is generally an airtight passage mounted on the wall of a vacuum chamber. One or more conductors may be provided in an electrical feedthrough. Each conductor is surrounded by insulators to keep it insulated from the wall of the chamber. The insulators may be glass or ceramic materials.

Some electric feedthroughs have glass-to-metal seals with pin contacts used with standard connectors. Some other approaches use ceramic-metal brazed pins mounted on metal flanges. These conventional feedthroughs are not easily customizable. For example, they cannot provide higher density custom arrays of contacts with higher voltage stand-offs from contact to interface and contact to contact. It is thus desirable to have an improved electrical feedthrough that is customizable and reliable for making an electrical connection between vacuum and atmosphere chambers.

It is within this context that aspects of the present disclosure arise.

SUMMARY

According to aspects of the present disclosure, an apparatus comprises a feedthrough that includes a ceramic structure having a first surface and a second surface at opposing ends of the ceramic structure. Conductors embedded in the ceramic structure extend from the first surface to the second surface to form corresponding arrays of conductive contacts at the first surface and the second surface. The conductors are flush with the first surface of the ceramic structure. A cable electrically connects to the contacts at the first surface of the ceramic structure. The cable has a contact array pattern that matches the array of conductive contacts on the first surface of the ceramic structure.

In some implementations, the first surface of the feedthrough is provided in a low pressure environment and the second surface is provided in an atmosphere environment.

In some implementations, the first surface of the feed through is provided in an atmosphere environment and the second surface is provided in a low pressure environment.

In some implementations, the embedded conductors are formed from tungsten.

In some implementations, the cable has a conductive material on a bottom layer. The conductive material has a thickness ranging from 0.5 mil to 1 mil. Furthermore, an electrically insulating coverlay may be disposed on top of the conductive material with a pattern of holes matching the embedded arrays of conductive contacts on the first surface of the feed through. The coverlay may have a thickness of about 1 mil.

In some implementations, an interposer is provided between the first surface of the feedthrough and the cable. The interposer has springs for providing electrical connection between the feedthrough and the cable. The interposer springs may be aligned with the holes of the coverlay.

In some implementations, the cable is aligned to pins on a clamp which clamps the cable to the feedthrough.

In some implementations, each of the conductive contacts is about 0.65-0.75 mm diameter. The array of the conductive contacts at the first surface, at the second surface, or both may have a pitch ranging from 1 mm to 4 mm.

In some implementations, both ends of the embedded conductors are flush with the first and second surfaces of the feedthrough, respectively.

In some implementations, a pattern of the array of conductive contacts at the first surface is different from a pattern of the array of conductive contacts at the second surface.

According to another aspect of the present disclosure, a method comprises forming a feedthrough by forming a ceramic structure having a first surface and a second surface at opposing ends of the ceramic structure with conductors embedded in the ceramic structure and extending from the first surface to the second surface of the ceramic to form corresponding arrays of conductive contacts at the first surface and the second surface, wherein the conductors are flush with the first surface of the ceramic structure; and electrically connecting a cable to the contacts at the first surface of the ceramic structure, wherein the cable has a contact array pattern that matches the array of conductive contacts on the first surface of the ceramic.

In some implementations, the ceramic structure is formed by forming one or more via holes in one or more green ceramic sheets; filling each of the via holes with a conductive paste; stacking each of the green ceramic sheets onto one another; and co-firing the stack of ceramic sheets.

Some implementations, the method further includes mounting the feedthrough to an opening in a plate of a chamber. The feedthrough may be mounted, e.g., by clamping the first surface of the ceramic structure to the plate to make a seal to the plate, e.g., with a sealing member, such as an O-ring or gasket.

In some implementations, the method includes forming a plurality of green ceramic sheets, wherein the forming the via holes includes changing a pattern of via holes in a first sheet of the plurality of sheets relative to a pattern of via holes in a second sheet of the plurality of sheets.

In some implementations, the method includes forming a plurality of green ceramic sheets, wherein the forming the via holes includes transversely shifting at least one of the via holes in a first sheet of the plurality of sheets relative to a corresponding via hole in a second sheet that is adjacent to the first sheet, and wherein the forming the conductors further includes applying the conductive paste to a surface of the second sheet to form a conductive trace connecting the transversely shifted via hole in the first sheet to the corresponding via hole in the second sheet.

In some implementations, the method includes forming a plurality of green ceramic sheets, wherein the forming the via holes includes combining at least two of the via holes in a first sheet of the plurality of sheets into one corresponding via hole in a second sheet that is adjacent to the first sheet, and wherein the forming the conductors further includes applying the conductive paste to a surface of the first or second sheet to form a conductive trace connecting the at least two via holes in the first sheet to the corresponding via hole in the second sheet.

BRIEF DESCRIPTION OF THE DRAWINGS

Aspects of the present disclosure will become apparent upon reading the following detailed description and upon reference to the accompanying drawings in which.

DETAILED DESCRIPTION

In the following Detailed Description, reference is made to the accompanying drawings, which form a part hereof, and in which is shown by way of illustration specific implementations of aspects of the present disclosure. The drawings show illustrations in accordance with examples of specific implementations, which are also referred to herein as "examples". The drawings are described in enough detail to enable those skilled in the art to practice the subject matter of the present disclosure. Because components of certain specific implementations can be positioned in a number of different orientations, directional terminology is used for purposes of illustration and is in no way limiting. It is to be understood that other implementations may be utilized and structural or logical changes may be made without departing from the scope of the present disclosure.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

Embodiments of the present disclosure include a multilayer ceramic substrate with one or more hermetically sealed and filled metal vias in combination with flexible printed circuit cables, and optionally interposers, to provide a custom electric feed through for vacuum to atmosphere chambers.

Figure 1:
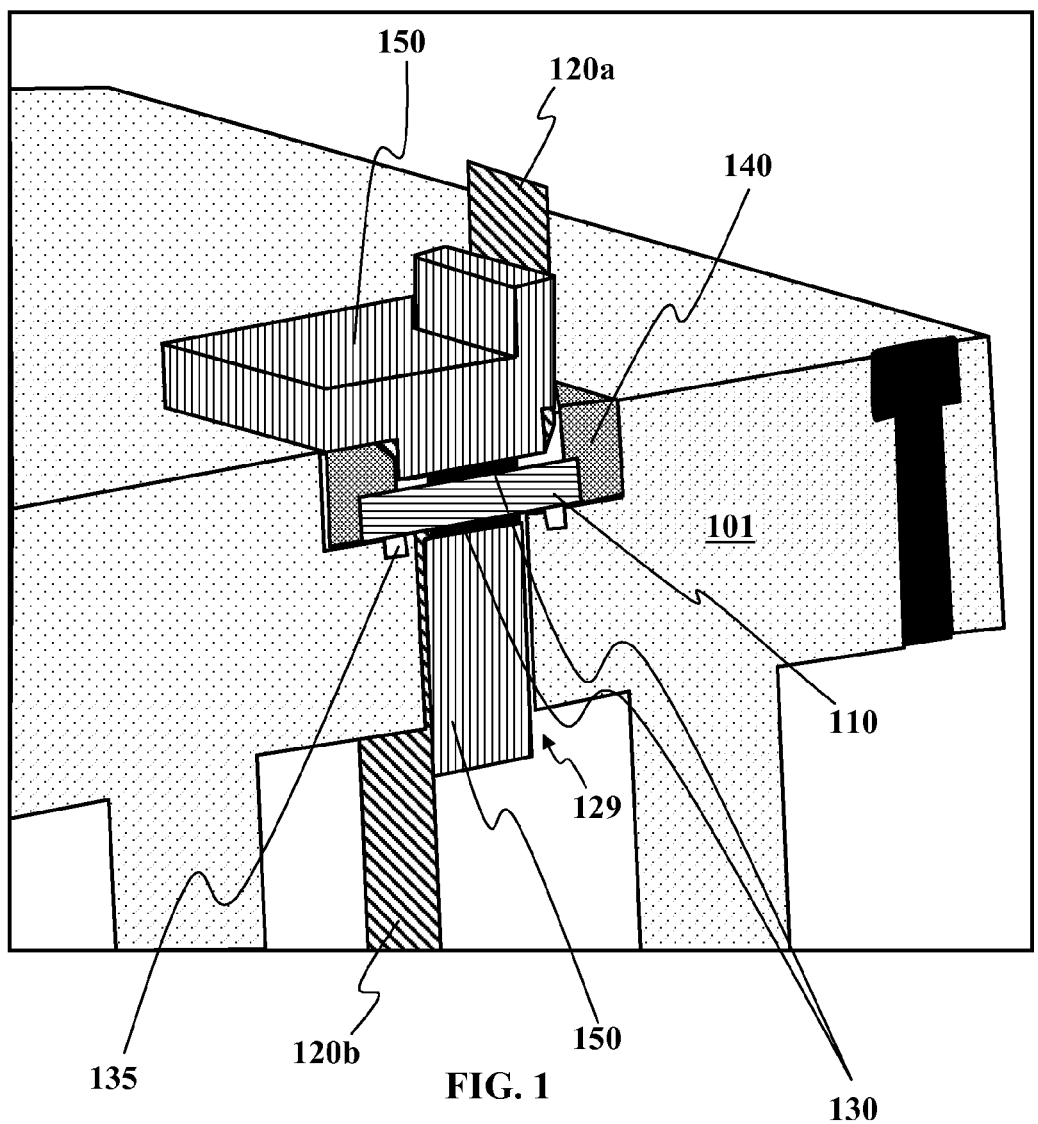
FIG. 1 is a perspective view of an apparatus including an electrical feedthrough according to an aspect of the present disclosure.

FIG. 1 is a perspective view of an apparatus including an electrical feedthrough according to an aspect of the present disclosure. The apparatus of FIG. 1 is mounted on a wall of a vacuum chamber 101 for providing electrical connection from the exterior of the chamber to devices within the chamber. The apparatus includes a feedthrough 110, two flexible cable 120a and 120b, an interposer 130 (optional), an O-ring 135 (which may be disposed at least partially within an O-ring groove of the wall of the chamber), and one or more clamps for clamping the ceramic feedthrough 110 to the chamber and the cables 120 to the feedthrough 110. In alternative implementations, a gasket or other sealing member may be used instead of an O-ring to seal the feedthrough 110 to the wall of the chamber. In the illustrated embodiment of FIG. 1, the clamps may include one or more feedthrough clamps 140 for clamping the ceramic feedthrough 110 to the chamber, and one or more cable clamps 150 for clamping the cables 120 to the feedthrough 110. Thus, in the example depicted in FIG. 1, only the feedthrough clamp 140 secures the feedthrough 110 to the plate of the chamber 101, while the cable clamps 150 secure the flex cables 120a/120b to the feedthrough 110.

Figure 2A:
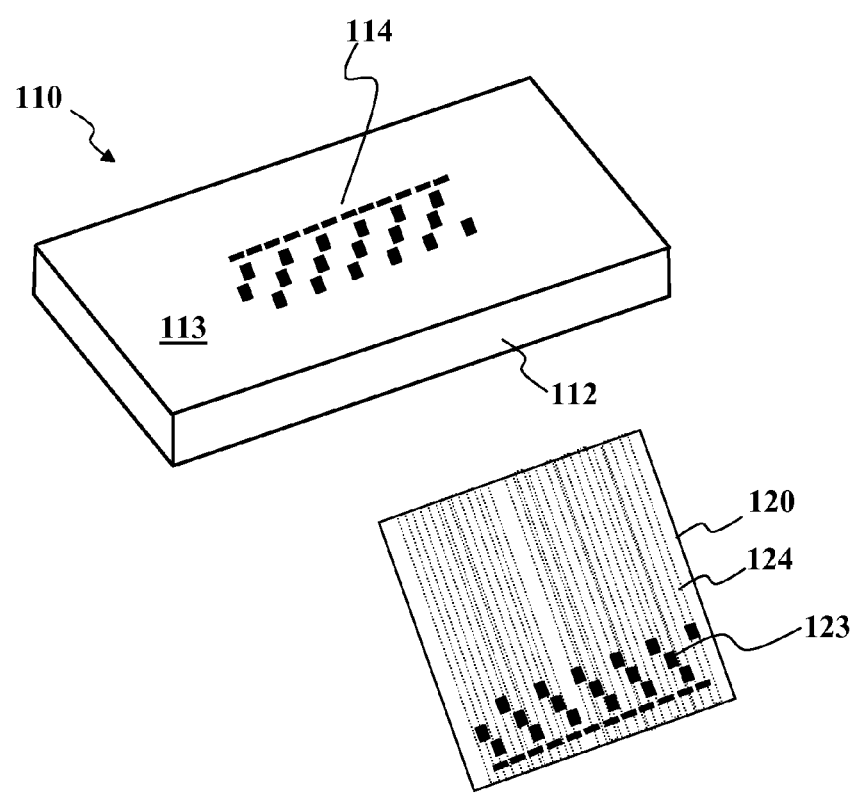
FIG. 2A is a perspective view of an electrical feedthrough according to an aspect of the present disclosure.
Figure 2B:
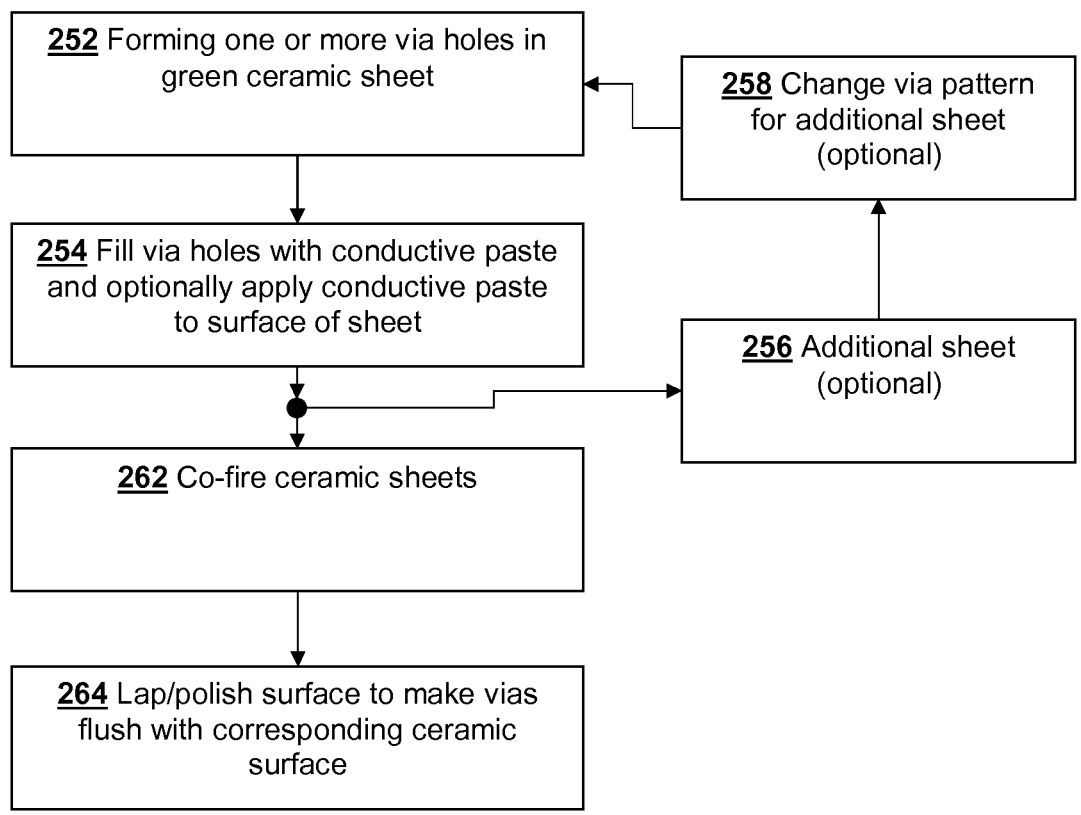
FIG. 2B is a flow diagram of a method of an electric feedthrough according to an aspect of the present disclosure.

FIG. 2A depicted a top view of a feedthrough 110 according to an aspect of the present disclosure. The feedthrough 110 includes a structure of ceramic materials 112 with embedded conductors forming arrays of conductive contacts 114 on the surface of the ceramic structure 112. A sealing surface 113 of the feedthrough may be mounted against a plate/wall of the chamber 101 to form a seal. An O-ring in the O-ring groove may form a seal with the sealing surface of the feedthrough when it is clamped to the plate/wall of the chamber. According to additional aspects, another sealing member, such as a gasket may be used instead of an O-ring. FIG. 2B depicts a method of forming the feedthrough 110. The feedthrough 110 may be manufactured using multilayer ceramic manufacturing practices in which thin layers of green ceramic sheets are stacked onto each other with embedded conductors. The stack is then co-fired at high temperatures to form a monolithic and hermetically sealed structure. It is noted that "green ceramic sheet" used herein refers to an unfired ceramic sheet.

Specifically, to manufacture the feedthrough 110, a green ceramic sheet may be selected. In some implementations, this ceramic sheet may have a thickness of 0.004 to 0.025 inches and may be formed of, e.g., beryllium oxide, aluminum nitride, alumina, or any other tape cast ceramic. As indicated at 252 of FIG. 2B, one or more via holes may be formed into the green ceramic sheet. In some implementations, the via holes may be punched in to the sheet using, e.g., a punch tool. Thereafter, a conductive paste may fill in the via holes, as indicated at 254 of FIG. 2B. In one example, the conductive paste may include one or more metals such as tungsten, silver, gold, molybdenum, manganese or suitable combinations of two or more of these metals. In some implementations, the via holes in the ceramic sheet may be filled with the conductive paste by a squeegee or similar tool in a manner analogous to applying grout to tile. Silk screen printing may be used to apply the conductive paste to the surface of the ceramic sheet, in order to optionally form a conductive path on the surface of an individual ceramic sheet during layering. At least one end of the conductive paste is flush with a corresponding surface of the ceramic sheet. In some implementations, the top surface and the bottom surface of the ceramic sheet are polished to be substantially flush with the conductive paste.

Additional green ceramic sheets may be formed with paste filled via holes as described above, as indicated at 256 of FIG. 2B. In some implementations of the present disclosure, opposing sides of the feedthrough 110 depicted in FIG. 2A may be formed with different contact patterns on opposing sides, e.g., different patterns for the vacuum side and atmosphere side. Accordingly, the pattern of vias may be changed in one or more successive layers, as indicated at 258 of FIG. 2B. For example, the vias may optionally be transversely shifted and/combined for one or more of the multiple ceramic sheets. Metal traces may be formed on the surface of the ceramic sheet to make connections to vias that are transversely shifted. Then the multiple sheets are stacked on top of each other. In some implementations, the multiple sheets may be stacked with all of the conductive paste filled vias of each sheet being aligned on top of each other. However, as noted above, it is possible for one or more of the vias to be transversely shifted relative to another layer, e.g., to form different contact patterns on the opposing sides of the ceramic stack. In these implementations, it is possible for not all of the vias of the different sheets to be aligned with one another where the via patterns on one or more of the ceramic sheets differ. Accordingly, when the multiple sheets are stacked, one or more transversely shifted or combined vias may be aligned to metal traces on an adjacent ceramic sheet in order to form a conductive path through the ceramic structure.

Figure 2C:
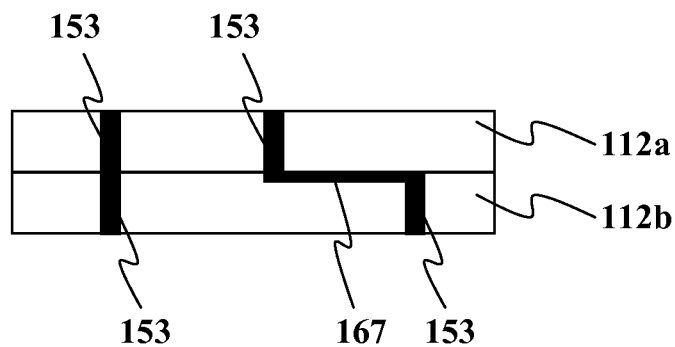
FIG. 2C is a cross section view of a ceramic structures having transversely shifted vias according to an aspect of the present disclosure.
Figure 2D:
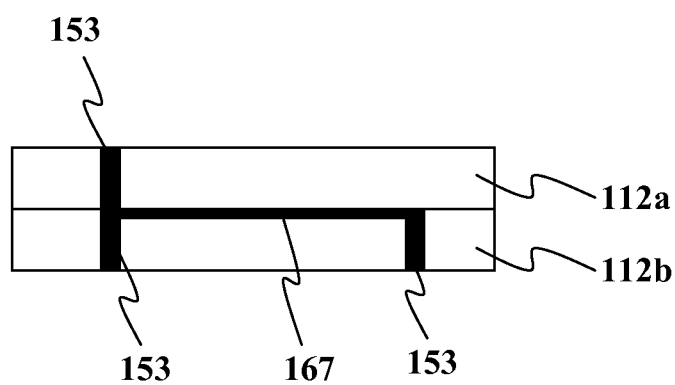
FIGS. 2D-2E are cross-sectional views of a ceramic structures having combined vias according to aspects of the present disclosure.
Figure 2E:
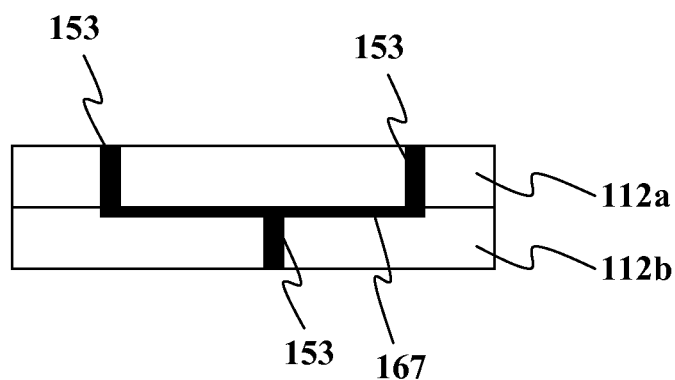

FIGS. 2C-2E are schematic diagrams depicting examples of different via patterns in adjacent ceramic sheets 112a/112b, which may be used to form different contact array patterns on opposing sides of the ceramic feedthrough 110. The examples depicted in FIGS. 2C-2E depict only two adjacent sheets and a small number of conductive vias 153 for purposes of explanation only, but it is noted that it is possible for vias to be transversely shifted and/or combined multiple times within a stack and it is possible to transversely shift and/or combine any number of vias at adjacent sheets.

FIG. 2C depicts in example where at least one of the vias 153 is transversely shifted relative to the corresponding via in the adjacent sheet. Specifically, as shown in FIG. 2C, the rightmost via in sheet 112a is transversely shifted relative to the corresponding via in the adjacent sheet 112b. The conductive paste may be applied to the surface of the adjacent sheet 112b, e.g., by screen printing, to form a conductive trace 167 connecting the corresponding vias 153. FIGS. 2D and 2E depict additional examples where at least two of the vias 153 are combined into one corresponding via in the adjacent sheets 112a/112b.

The stack of multiple sheets and conductive paste filling the via holes are co-fired, as indicated at 262 of FIG. 2B, to form a monolithic and hermetically sealed three-dimensional structure with one or more embedded conductive vias forming at least one conductive path extending through the ceramic laminated structure. As indicated at 264 of FIG. 2B, the surface of the ceramic may be lapped to make the via ends coplanar with the ceramic surface and optionally polished to make the conductors flush with the ceramic, e.g., the top and/or bottom surfaces of the co-fired stack.

The conductive vias extending on the surface of the laminate structure 112 form arrays of conductive contacts 114 of FIG. 2A. As shown in FIG. 2A, at least one end (e.g., the top end) of each conductive via that runs through the laminate structure 112 is flush with the corresponding surface (e.g., top surface) of the laminate structure 112. The pattern of the arrays of conductive contacts 114 may be customized by forming via holes on the green ceramic sheets in a desired pattern. Since, in the present disclosure, the via holes are formed in each green ceramic sheet before firing the stack, smaller sized contacts may be formed as compared to contact holes formed by drilling after firing the stack of ceramic sheets. Moreover, custom contact patterns may be formed in which opposing sides of the feedthrough 110, e.g., a vacuum side and an atmosphere side, have different custom contact patterns formed by transversely shifting and/or combining conductors at one or more of the intermediate layers of the multiple sheets.

Connectors, such as flexible printed circuit cables, with mating contact array patterns may be used on both sides of the ceramic feedthrough, either with or without an interposer, to make electrical contact. As shown in FIG. 1, the apparatus 100 includes two flexible printed circuit cables 120a and 120b, one on the air side (or "atmosphere" side) and the other on the vacuum side (or "low pressure" side). In the illustrated example, flex cable 120a is on the air side, while flex cable 120b is on the vacuum side. The mating contact array pattern of each of these flexible cables 120a and 120b may have a mirror image of the contact array on the corresponding side of the ceramic feedthrough, and the mating contact of the connector 120a/120b may face the contact array on the ceramic feedthrough for electrical connection. In some implementations, other connectors may be used instead of the flex cables, such as custom designed connectors. FIG. 2A depicts a more detailed view of a connector 120 that may be used to make electrical contact with the feedthrough 112 depicted in FIG. 2A. The illustrated connector 120 may be a flex cable with a mating contact array pattern 123 that matches the contact array pattern 114 for the corresponding side of the feedthrough 112.

Figure 3:
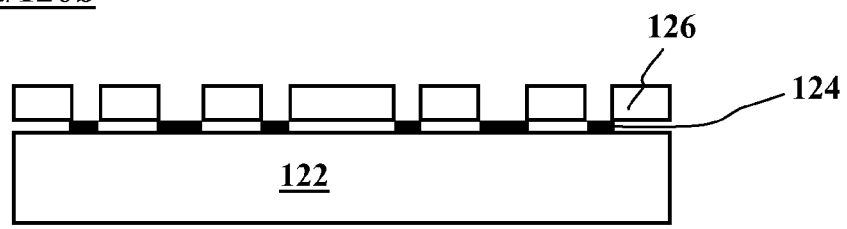
FIG. 3 is a cross section view of a flexible printed circuit cable used in the apparatus according to one aspect of present disclosure

FIG. 3 shows an example of a connector 120a/120b according to one aspect of present disclosure. The connector 120a/120b may be a flexible printed circuit cable that includes an electrically insulating bottom layer 122 covered with an electrically conductive material 124. The bottom layer 122 may be a layer of polyimide having a thickness of about 0.001 to 0.006 inches. The conductive material 124 on the bottom layer 122 may be copper or another conductive material. For example, the connector 120a/120b may be a polyimide flex cable with copper cladding.

In some embodiments, the conductive material 124 may be etched to form a pattern. In one example, the conductive material 124 may be divided as a number of conductive strips that are electrically isolated from each other. In some implementations, the conductive material 124 is copper clad (about 0.5 oz. to 1 oz.) and the thickness of the conductive material 124 is about 0.5 mil to 1 mil. In some embodiments, a coverlay 126 is formed on top of the conductive material 124 with a pattern of holes matching the pattern of the corresponding contact array on the ceramic feedthrough. For example, with reference to the connector 120 depicted in FIG. 2A, the pattern of holes may define the mating contact pattern 123. In some implementations, the coverlay 126 may be formed of polyimide in a thickness about 1 mil.

Referring back to FIG. 1, the feedthrough 110 may be mounted on a wall of the chamber housing 101. In some embodiments, the feedthrough 110 is mounted on an opening 129 in a plate/wall of the chamber and is sealed to the plate/wall. In the illustrated embodiment, the flexible cable 120a and 120b are aligned to pins on a corresponding cable clamp 150 which clamps the cables to the feedthrough 110.

The cable 120a/120b and cable clamp 120 assembly are also be aligned to the feedthrough 110 by creating location fit between the cable clamp 150 and the opening 129 in the plate. This structure may avoid the need to use alignment pins bonded to the ceramic, which may not bond very well. However, in other implementations, the flexible printed circuit cable 120a and 120b may be aligned with the feedthrough using pins bonded to the feedthrough.

Figure 4:
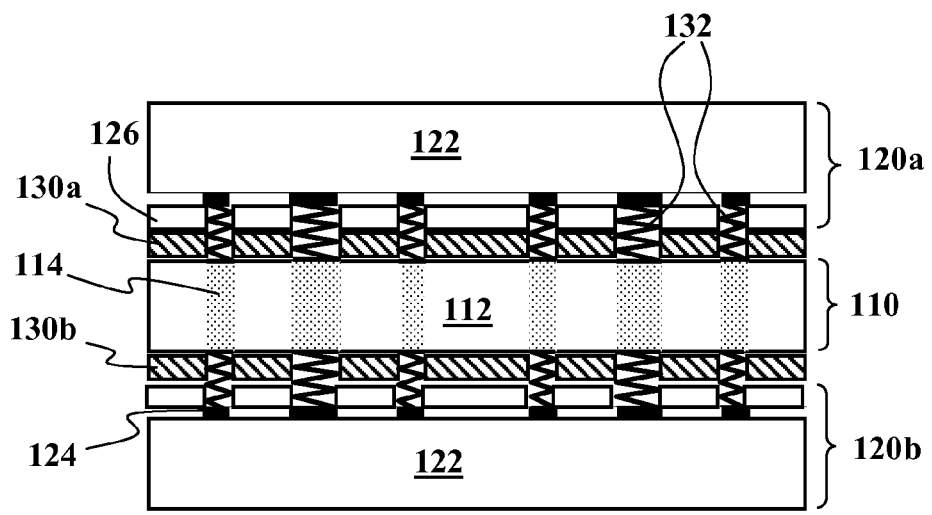
FIG. 4 is a cross section view of portions of the apparatus 100 of FIG. 1.

As shown in FIG. 1, an interposer 130 may be optionally provided between the feedthrough 110 and the flexible cable 120a or 120b. An interposer is an electrical interface routing between one socket and connection to another. FIG. 4 depicts a more detailed cross sectional view of the feedthrough 110, the connectors 120a/120b, and interposers 130a/130b providing electrical interface between the feedthrough and connectors. Specifically, in the example of FIG. 4, flexible cables 120a/120b each have a mirror image of the corresponding contact array of the feedthrough 110, and that faces the contact array on the feedthrough with an interposer 130a/130b with small spring contacts 132 therebetween. Interposer springs 132 make contact to the conductive layer 124 through holes in coverlay 126.

Embodiments of the present disclosure provide a hermetically sealed via or array of vias in a multi-layer ceramic plate as an electrical feedthrough for high vacuum chamber. Some embodiments may provide an easier means for high density custom arrays of contacts with higher voltage standoff capability. They also provide the option to have varying contact patterns from vacuum side vs. atmosphere side by transversely shifting or combining conductors in one of the intermediate layers. Also a final metal coating may be applied or plated to metal surfaces for high temperature brazing or low temperature soldering components to the ceramic feedthroughs.

According to aspects of the present disclosure, an electric feedthrough apparatus and method of fabricating the same may avoid cracking and allow for smaller pitch and pin size of the conductive contacts/vias. In some implementations for a voltage of 100 V or less, the conductive contacts/vias may be about 0.65-0.75 mm diameter and 1 mm pitch. In other implementations, the conductive contacts/vias may be about 0.65-0.75 mm diameter with 4 mm pitch for higher voltage, e.g., 1200 V. Thus, embodiments of the present disclosure may be used on any system requiring large number of contacts in a tight space at high voltage to ground difference.

The appended claims are not to be interpreted as including means-or-step-plus-function limitations under 35 USC §112 (f), unless such a limitation is explicitly recited in a given claim using the phrase "means for." Any element in a claim that does not explicitly state "means for" performing a specified function, is not to be interpreted as a "means plus function" or "step plus function" clause as specified in 35 USC §112(f). In particular, the use of "step of" in the claims herein is not intended to invoke the provisions of 35 USC §112(f).

What is claimed is:

1. An apparatus, comprising:
   a feedthrough, wherein the feedthrough includes a ceramic structure having a first surface and a second surface at opposing ends of the ceramic structure, wherein the feedthrough includes conductors embedded in the ceramic structure and extending from the first surface to the second surface of the ceramic structure to form corresponding arrays of conductive contacts at the first surface and the second surface, and wherein the conductors are flush with the first surface of the ceramic structure; and
   a cable, detachable from the feedthrough, electrically connected to the contacts at the first surface of the ceramic structure, wherein the cable has a contact array pattern that matches the array of conductive contacts on the first surface of the ceramic structure.

2. The apparatus of claim 1, wherein the first surface of the feedthrough is provided in a low pressure environment and the second surface is provided in an atmosphere environment.

3. The apparatus of claim 1, wherein the embedded conductors are formed from tungsten, silver, gold, manganese, molybdenum or combinations of two or more of these metals.

4. The apparatus of claim 1, wherein the cable has a conductive material coated on a bottom layer.

5. The apparatus of claim 4, wherein the conductive material has a thickness ranging from 0.5 mil to 1 mil.

6. The apparatus of claim 4, wherein an electrically insulating coverlay is formed on top of the conductive material with a pattern of holes matching the array of conductive contacts on the first surface of the ceramic structure.

7. The apparatus of claim 6, wherein the coverlay has a thickness of about 1 mil.

8. The apparatus of claim 1, wherein an interposer is provided between the first surface of the feedthrough and the cable.

9. The apparatus of claim 8, wherein the interposer includes springs for providing electrical connection between the feedthrough and the cable.

10. The apparatus of claim 1, wherein the cable is aligned to pins on a clamp which clamps the cable to the feedthrough.

11. The apparatus of claim 1, wherein each of the conductive contacts is about 0.65-0.75 mm diameter, and wherein at least one of the arrays of conductive contacts at the first and second surface has a pitch ranging from 1 mm to 4 mm.

12. The apparatus of claim 1, wherein the conductors are flush with the second surface of the ceramic structure.

13. The apparatus of claim 1, further comprising a second cable electrically connected to the second surface, wherein the second cable has a contact array pattern that matches the array of conductive contacts on the second surface of the ceramic structure.

14. The apparatus of claim 1, wherein a pattern of the array of conductive contacts at the first surface is different from a pattern of the array of conductive contacts at the second surface.

15. A method comprising:
   forming a feedthrough, wherein the forming the feedthrough includes:
   forming a ceramic structure having a first surface and a second surface at opposing ends of the ceramic structure;
   forming conductors embedded in the ceramic structure and extending from the first surface to the second surface of the ceramic structure to form corresponding arrays of conductive contacts at the first surface and the second surface, wherein the conductors are flush with the first surface of the ceramic structure; and
   electrically connecting a cable to the contacts at the first surface of the ceramic structure, wherein the cable is detachable from the feedthrough and has a contact array pattern that matches the array of conductive contacts on the first surface of the ceramic structure.

16. The method of claim 15, wherein the forming the ceramic structure and the forming the conductors includes:
   forming one or more via holes in one or more green ceramic sheets;
   filling each of the via holes with a conductive paste;
   stacking each of the green ceramic sheets onto one another; and
   co-firing the stack of ceramic sheets.

17. The method of claim 16, wherein the one or more green ceramic sheets are a plurality of green ceramic sheets, wherein the forming the via holes includes changing a pattern of via holes in a first sheet of the plurality of sheets relative to a pattern of via holes in a second sheet of the plurality of sheets.

18. The method of claim 16, wherein the one or more green ceramic sheets are a plurality of green ceramic sheets, wherein the forming the via holes includes transversely shifting at least one of the via holes in a first sheet of the plurality of sheets relative to a corresponding via hole in a second sheet that is adjacent to the first sheet, and wherein the forming the conductors further includes applying the conductive paste to a surface of the second sheet to form a conductive trace connecting the transversely shifted via hole in the first sheet to the corresponding via hole in the second sheet.

19. The method of claim 16, wherein the one or more green ceramic sheets are a plurality of green ceramic sheets, wherein the forming the via holes includes combining at least two of the via holes in a first sheet of the plurality of sheets into one corresponding via hole in a second sheet that is adjacent to the first sheet, and wherein the forming the conductors further includes applying the conductive paste to a surface of the first or second sheet to form a conductive trace connecting the at least two via holes in the first sheet to the corresponding via hole in the second sheet.

20. The method of claim 15, further comprising:
   mounting the feedthrough to an opening in a plate of a chamber.

21. The method of claim 15, wherein the mounting the feedthrough includes clamping the first surface of the ceramic structure to the plate and against a sealing member to make a seal to the plate.

* * * * *